United States Patent
Chinthakindi et al.

(10) Patent No.: US 6,696,343 B1
(45) Date of Patent: Feb. 24, 2004

(54) MICRO-ELECTROMECHANICAL VARACTOR WITH ENHANCED TUNING RANGE

(75) Inventors: Anil K. Chinthakindi, Fishkill, NY (US); Robert A. Groves, Highland, NY (US); Kenneth J. Stein, Sandy Hook, CT (US); Seshadri Subbanna, Brewster, NY (US); Richard P. Volant, New Fairfield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/459,978

(22) Filed: Jun. 12, 2003

Related U.S. Application Data

(62) Division of application No. 10/278,211, filed on Oct. 22, 2002.

(51) Int. Cl.[7] .......................... H01L 21/20; H01L 21/26
(52) U.S. Cl. ....................... 438/379; 438/381; 438/411; 438/396
(58) Field of Search ........................ 438/379, 48, 381, 438/309, 133, 396, 171, 411, 571, 478; 257/415, 421, 467, 528, 532, 777, 306, 783, 307, 308, 782

(56) References Cited

U.S. PATENT DOCUMENTS

| | | | |
|---|---|---|---|
| 6,232,847 B1 | * 5/2001 | Marcy et al. | 331/167 |
| 6,242,989 B1 | * 6/2001 | Barber et al. | 331/177 V |
| 6,355,534 B1 | * 3/2002 | Cheng et al. | 438/379 |
| 6,380,600 B1 | * 4/2002 | Alping et al. | 257/415 |
| 6,507,475 B1 | * 1/2003 | Sun | 361/281 |
| 6,621,137 B1 | * 9/2003 | Ma et al. | 257/528 |

* cited by examiner

Primary Examiner—Michael S. Lebentritt
(74) Attorney, Agent, or Firm—H. Daniel Schnurmann

(57) ABSTRACT

A three-dimensional micro- electromechanical (MEM) varactor is described wherein a movable beam and fixed electrode are respectively fabricated on separate substrates coupled to each other. The movable beam with comb-drive electrodes are fabricated on the "chip side" while the fixed bottom electrode is fabricated on a separated substrate "carrier side". Upon fabrication of the device on both surfaces of the substrate, the chip side device is diced and "flipped over", aligned and joined to the "carrier" substrate to form the final device. Comb-drive (fins) electrodes are used for actuation while the motion of the electrode provides changes in capacitance. Due to the constant driving forces involved, a large capacitance tuning range can be obtained. The three dimensional aspect of the device avails large surface area. When large aspect ratio features are provided, a lower actuation voltage can be used. Upon fabrication, the MEMS device is completely encapsulated, requiring no additional packaging of the device. Further, since alignment and bonding can be done on a wafer scale (wafer scale MEMS packaging), an improved device yield can be obtained at a lower cost.

16 Claims, 22 Drawing Sheets

Chip side

Carrier side

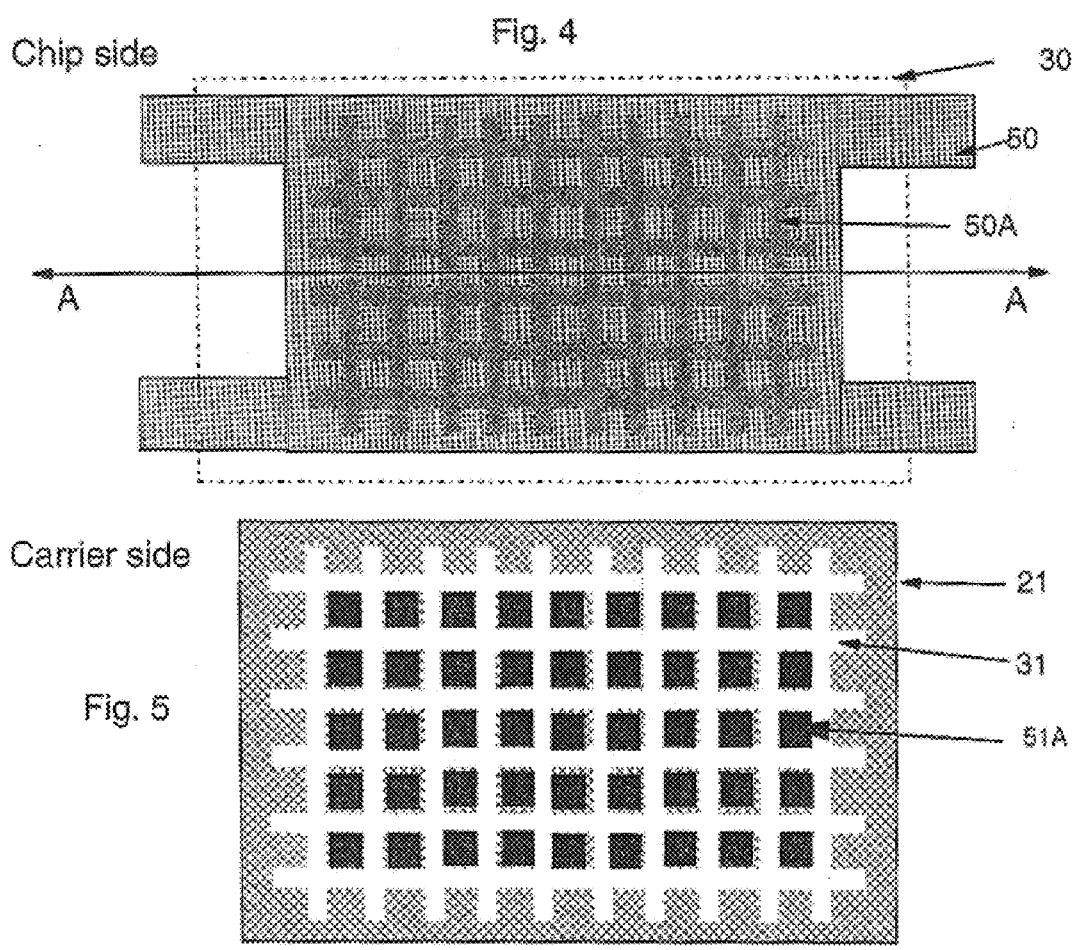

Chip side  Fig. 6
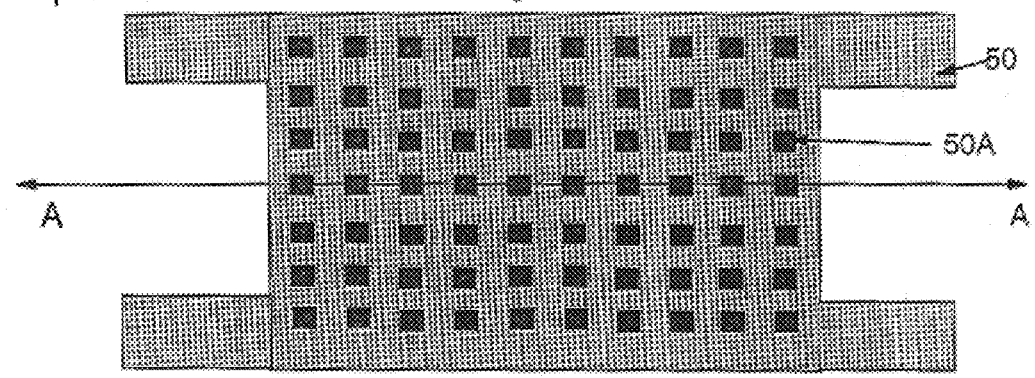
Carrier side
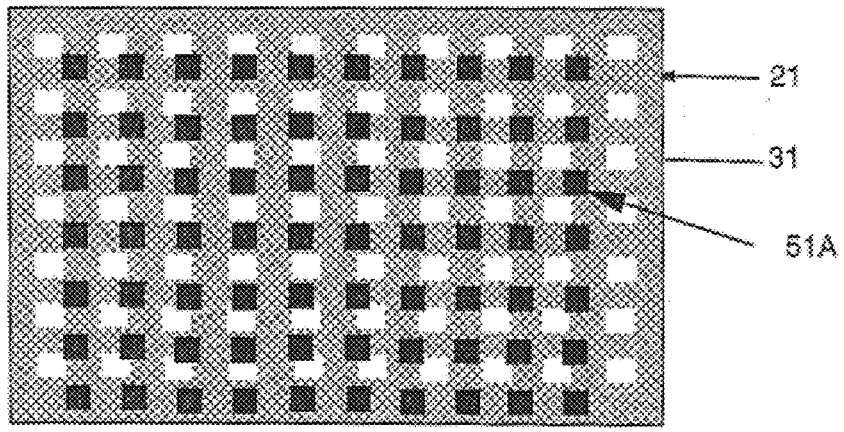
Fig. 7

Chip side:

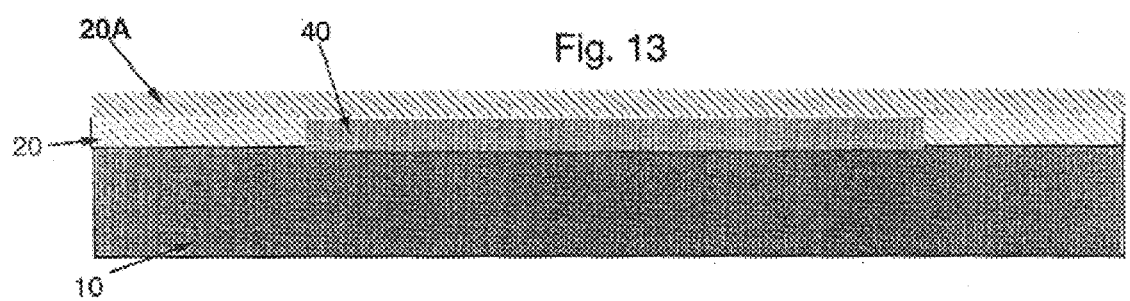
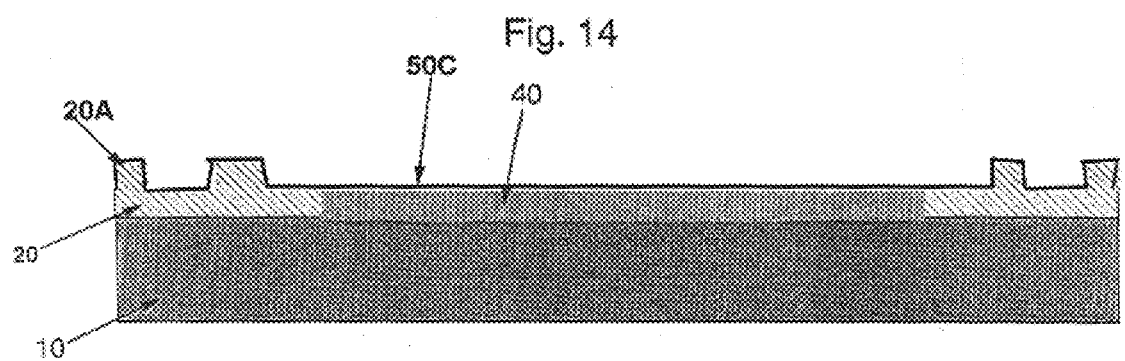

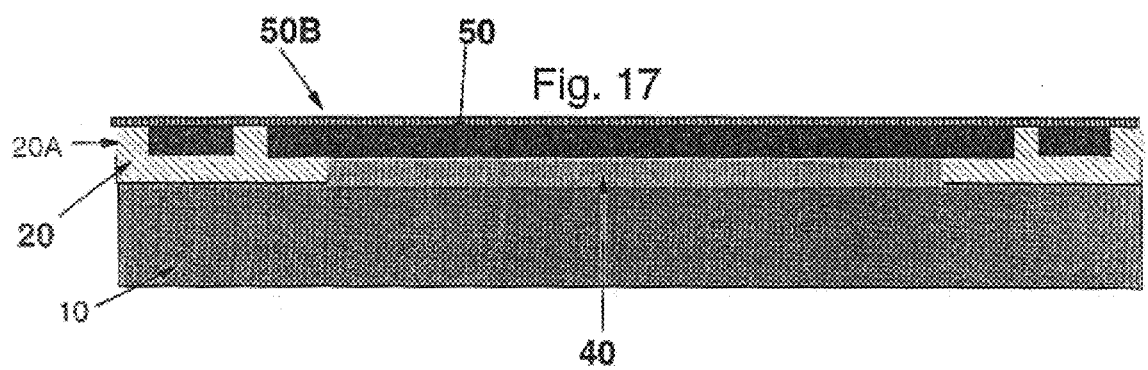
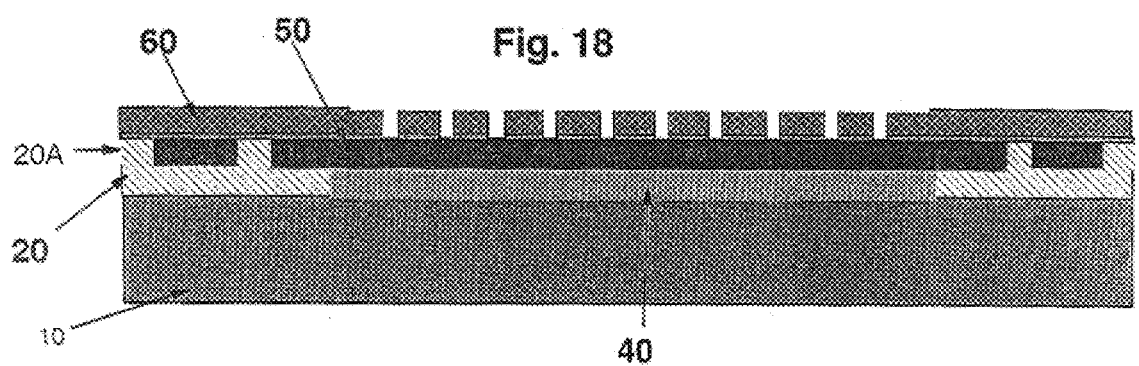

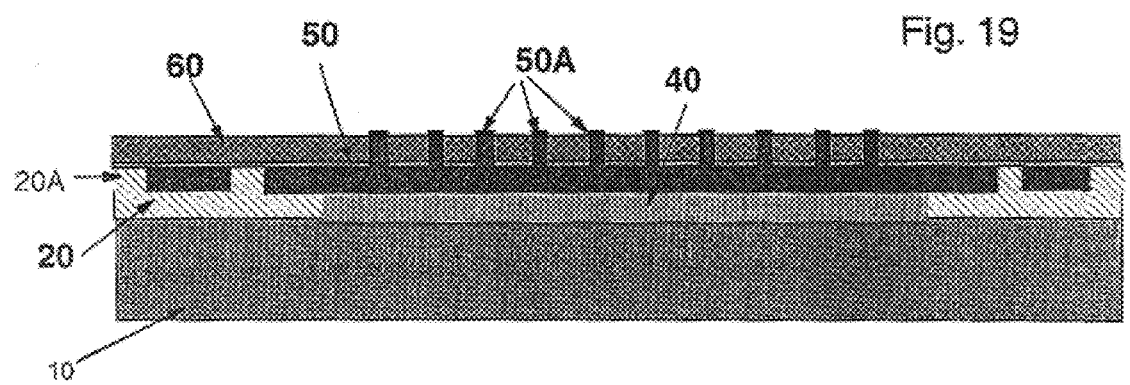
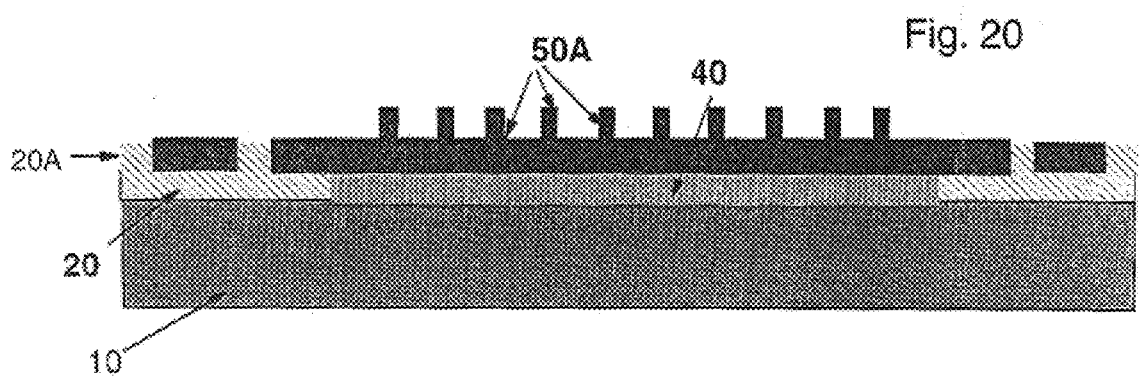

Carrier side:

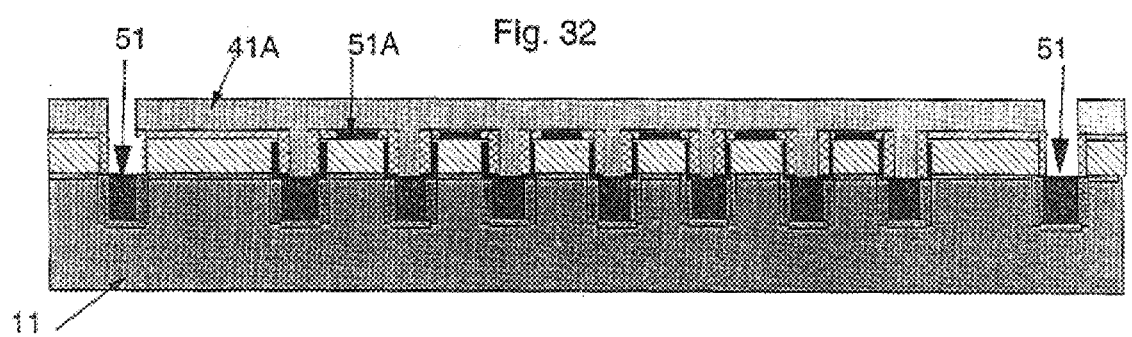
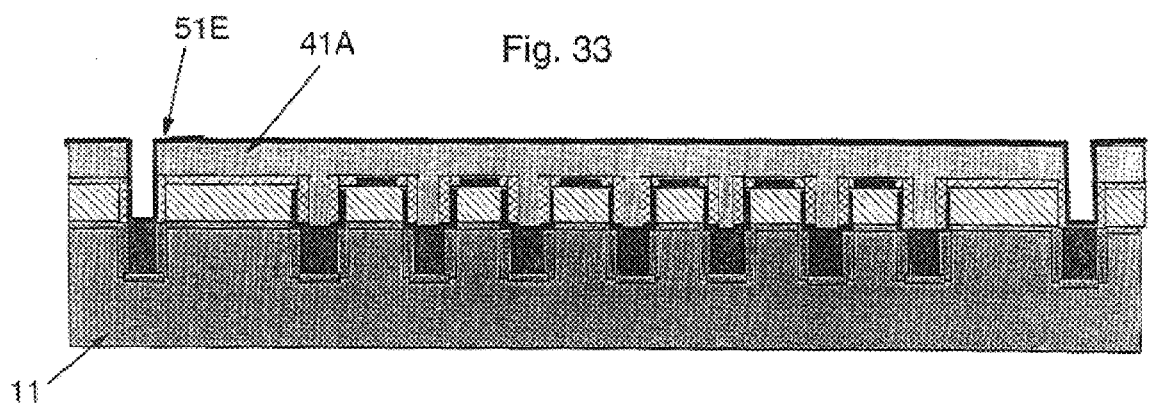

MICRO-ELECTROMECHANICAL VARACTOR WITH ENHANCED TUNING RANGE

CROSS REFERENCE TO RELATED APPLICATIONS

This is a Divisional of patent application Ser. No. 10/278,211, filed on Oct. 22, 2002.

FIELD OF THE INVENTION

This invention is generally related to microelectromechanical (MEM) switches and to a method of fabricating such structures, and more specifically, to a MEM variable capacitor that uses three-dimensional comb-drive electrodes (fins) by bonding a chip to a carrier substrate.

BACKGROUND OF THE INVENTION

Variable capacitors or varactors are a fundamental part of high-frequency and radio-frequency (RF) circuits. MEM variable capacitors have drawn considerable interest over the last few years due to their superior electrical characteristics. Variable capacitors using MEM technology can be easily implemented in standard semiconductor devices for applications in aerospace, consumer electronics and communications systems.

Many researchers have attempted to improve the tuning range of MEMS variable capacitors since the maximum capacitance tuning range achieved by using a parallel plate electrode approach is limited. This is due to the non-linear electrostatic forces involved during actuation. The parallel plate electrodes exhibit a typical "pull-down behavior" at one-third the gap distance, leading to a maximum tuning capacitance of 1.5. Most previous approaches have resulted in increased processing complexity and/or a large number of moving parts, leading to a drastic reduction in reliability. Additionally, packaging the MEMS device and integrating it into CMOS integrated circuit pose great challenges.

A. Dec et al., in an article entitled "RF micro-machined varactors with wide tuning range", published in the IEEE RF IC Symposium Digest, pp. 309–312, June 1998 describe building a MEMS variable capacitor by actuating the movable electrode using two parallel electrodes above and below the movable electrode. The total capacitance tuning range is significantly enhanced as a result of the individual capacitance between the top-movable and movable-bottom being in series. The maximum tuning range achievable using this approach is a ratio of 2:1. A. Dec et al. have reported achieving a tuning range as high as 1.9:1. Even though the tuning range is significantly improved using this approach, the process complexity is increased.

The inherent electromechanical aspects involved in present approach are quite different than the parallel plate approach. Comb-drive electrodes are used for actuation while control or signal electrodes sense the motion of the movable electrode. The resulting capacitance tuning range is greatly enhanced since the electrostatic forces are constant in nature. Since this device has three ports (two ports for DC bias and one port for the RF signals), the signal capacitance requires decoupling as is the case in a 2-port varactor device. Moreover, most prior art MEMS devices need to be separately packaged that, at least for MEM devices with moving parts creates certain processing issues that need to be resolved.

OBJECTS OF THE INVENTION

Accordingly, it is an object of the invention to provide a MEM variable capacitor device that utilized comb-drive electrodes (or fins) for actuation, while the control or signal electrodes sense the motion of the movable beam, leading to a change in capacitance.

It is another object to provide a MEM varactor device where the switch contacts are separated by a dielectric to provide electrical isolation between the control signal and the switching signal.

It is further an object to provide a MEM varactor device with comb-drive actuation for obtaining large capacitance ratio or tuning range.

It is yet another object to configure a plurality of MEM varactor devices in a variety of three dimensional arrangements.

It is still another object to provide a MEM varactor with increased drive electrode area for lower drive voltages.

It is still a further object to provide a method of fabricating a MEM switch using manufacturing techniques that are compatible with those applicable to CMOS semiconductor devices, which allows fabricating and packaging the MEMS device simultaneously and reduces the number of fabrication steps to a minimum while reducing the cost of processing.

SUMMARY OF THE INVENTION

MEMS based variable capacitors provide many advantages over conventional solid-state varactors. These devices are operated at higher quality factors leading to low loss during operation. Two types of MEMS varactors are described herein: parallel plate and comb-drive varactors. Most widely investigated MEMS varactors are parallel plate capacitors with a movable electrode and a fixed electrode. The major disadvantage when using these MEMS devices is the limited tuning range of operation obtained upon actuation of these devices. The inherent electromechanical aspects involved restrict the tuning range and lead to snap down of the movable electrode. This is often stated as "pull-down instability effect". The electrostatic forces acting on the movable electrode are non-linear in nature which cause this effect. In the comb-drive electrodes, the electrostatic forces acting on the movable electrode are linear in nature (directly proportional to the distance) which greatly enhances the tuning range. However, comb-drive electrodes are difficult to process and the change in capacitance obtained is very small (due to less area available).

In one aspect of the invention, the MEM switch described includes both of the approaches (parallel plate and comb-drive) that were thus far considered. Greater area is made available during tuning by using a parallel plate type model while incorporating the linear electrostatic forces from the comb-drive approach. The movable and fixed electrodes are processed separately on chip and carrier wafers. The chip side contains the fixed-fixed movable beam. The beam is fabricated with metal "fins" acting as comb electrodes. The carrier side has an actuator (DC electrodes) along the side walls and bottom of the trenches. The RF (signal) electrodes are positioned between the electrodes. The actuator electrodes are connected by way of "through vias" for electrical connection.

After completion of processing both the chip and the carrier wafers, the chip side is flipped onto the carrier wafer and precision aligned so as to make electrical connection. The height of the stud on the carrier side determines the air gap between the movable electrode and the fixed electrode. Finally the device can be encapsulated with polymeric material in order to provide controllable environment for the MEMS device during operation.

In another aspect of the invention, there is provided a semiconductor micro electromechanical (MEM) varactor that includes a first substrate having a movable beam anchored at least at one end of the movable beam to the first substrate, the movable beam having discrete fins protruding therefrom in a direction opposite to the first substrate; and a second substrate coupled to the first substrate having fixed electrodes, each of the fixed electrodes respectively facing one of the discrete fins, the discrete fins being activated by a voltage between the protruding fins and the fixed electrodes.

BRIEF DESCRIPTION OF THE DRAWINGS

These and other objects, aspects and advantages of the invention will be better understood from the detailed preferred embodiment of the invention when taken in conjunction with the accompanying drawings.

FIG. 4 shows a top-down view of the movable part (top, chip side) of the device with a maze type configuration of the comb-drive electrodes, shown in FIG. 1 according to the present invention.

FIG. 5 shows a top-down view of the fixed part (bottom, carrier side) of the device with a maze type configuration for the bottom electrodes, reflecting the FIG. 4 according to the present invention.

FIG. 6 shows a top-down view of the movable part (top, chip side) of the device with a another configuration of the comb-drive electrodes, shown in FIG. 1, according to the present invention.

FIG. 7 shows a top-down view of the fixed part (bottom, carrier side) of the device with another configuration for the bottom electrodes, reflecting the FIG. 6 according to the present invention.

FIG. 8 illustrates another configuration of the MEM varactor device, packaged using the solder bumps for electrical feed through.

FIGS. 9 through 21 show the process sequence used for the fabrication of the top chip side of the MEM varactor device, in accordance with the invention.

FIGS. 22 through 39 show the process sequence used for fabricating the bottom carrier side of the MEM varactor device, according to the invention.

DETAILED DESCRIPTION OF THE INVENTION

The present invention will now be described more fully, hereinafter with reference to the drawings, in which preferred embodiments are shown.

Figure 1:
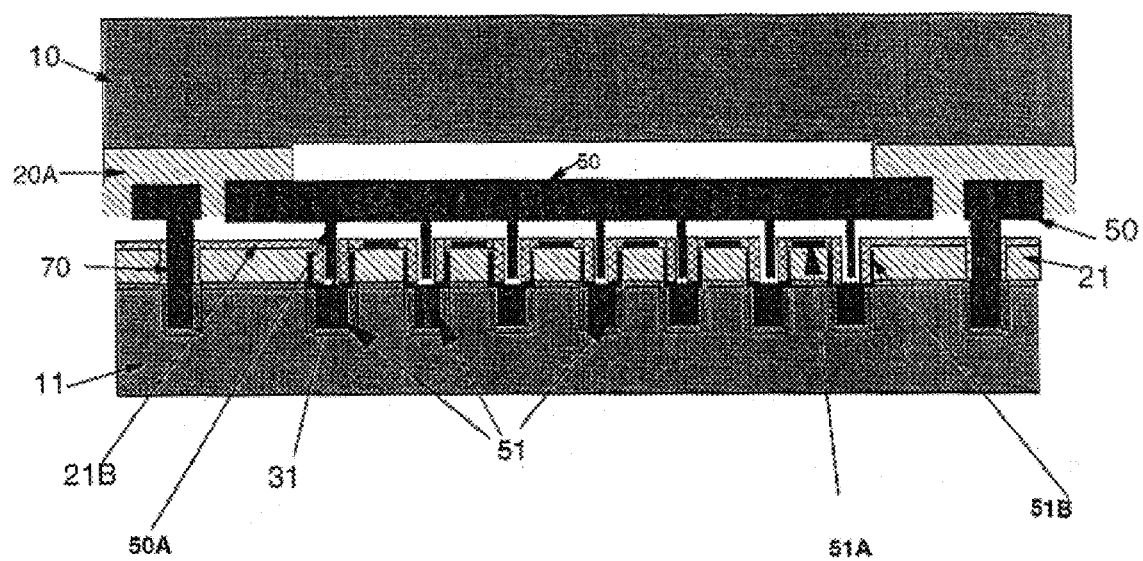
FIG. 1 is a cross-section view of the functional MEM varactor device according to the invention, seen at a cut through the lines A—A shown in FIG. 2.
Figure 2:
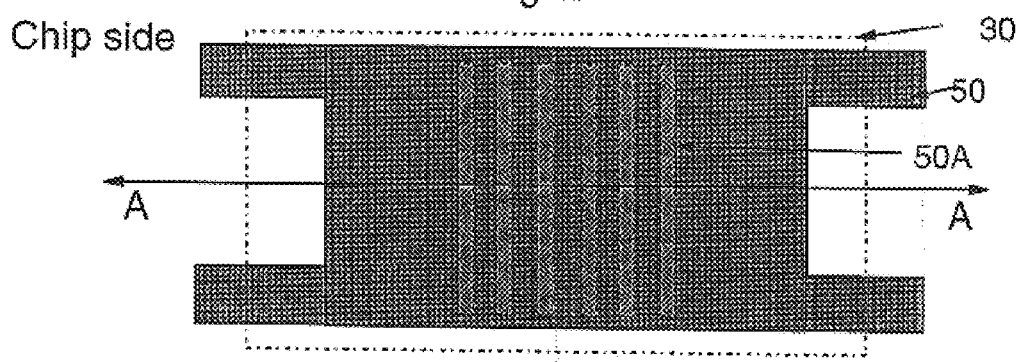
FIG. 2 is a top-down view of the movable part (top, chip side) of the device shown in FIG. 1, according to the present invention

FIG. 1 shows a cross-section of three dimensional MEM varactor device seen through a cut defined by line A—A (see FIG. 2). The device is built on two separate substrates 10 and 11 upon which the movable beam 50 and fixed electrodes 51 are respectively fabricated. Added to these fixed electrodes 51, are a series of driving combs 50A (electrodes) hovering above fixed electrodes 51 in a direction perpendicular to the movable beam. (The comb-drive structure consists of the combination of protrusions 50 and 50A). Hereinafter, the movable electrode substrate 10 will be referred to as the "chip side" while the fixed electrode substrate 11 will be referred to as "carrier side". Metal connections (not shown) to the electrodes are inserted within dielectric 20A, as it is typically done in the semiconductor fabrication process commonly known as Damascene process. In the preferred embodiment, the metal connections and electrodes are, preferably, copper, with a suitable liner and barrier material. Metal conductors 51, 51A and 51B are approximately 1000 Å thick. Conductor 51A is illustrative of a signal electrode wherein the gap distance between electrodes 51A and 50 determines a change in capacitance.

Referring to FIG. 2, the area of comb drive fins 50A varies significantly, and is typically of the order of $10 \mu m^2$. The length of movable beam 50 (FIG. 1) is also variable, ranging from 20 $\mu$m to over 200 $\mu$m. The driving electrodes 51B (FIGS. 1 and 3) stabilize the motion of the combs 50A to force them to maintain a perfectly linear and vertical motion to provide the necessary actuation. The attractive force between driving electrodes 51B and combs 50A depends on the overlapping areas of the comb-drive lateral surfaces. The area of electrode 50A ranges from 0.5 to 10 $\mu m^2$, although its dimensions may vary by making it deeper or longer in order to maximize the area of electrode 50A. The height of electrode 51B determines the gap distance between the movable beam 50 and fixed electrodes 51.

Figure 30:
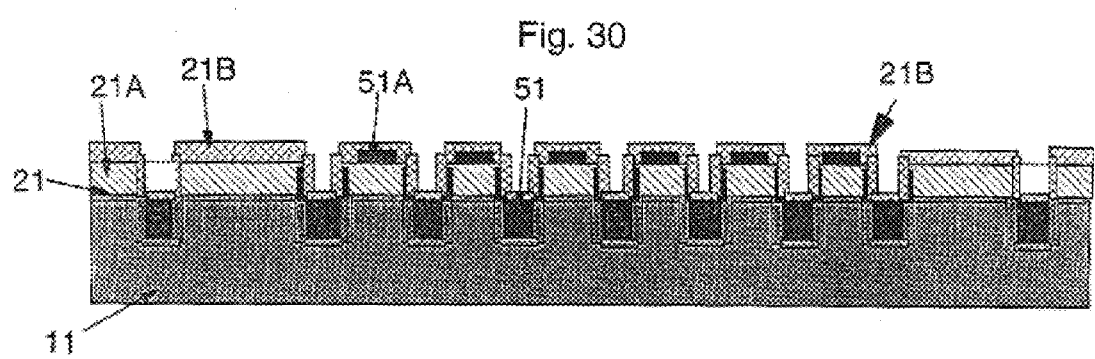

The width of trench gap 31 provides the necessary space for the electrodes to move up and down when a voltage is applied between electrode 50A (FIG. 1) and stationary electrode 51B (FIG. 1)When this occurs, electrodes 50A are attracted towards electrodes 51. The movable beam 50 is suspended from and loosely attached by a double hinged or fixed-fixed support. The moveable beam is anchored on either side to the dielectric 20A. The attraction between the comb drive electrodes 50A and 51B causes beam 50 to move along the direction of the comb-drive electrodes 51B. Control electrodes 51A are separated from the movable beam 50 by an insulating or semi-insulating dielectric material 21B (FIG. 30). Electrodes 51 can be exposed to the trench on one side or set in such a way that a thin layer of dielectric prevents physical contact between the electrodes 50A and 51. Preferably, a thin layer of dielectric of the order of 200–500 Å precludes them from touching each other If contact is made, a delta in potential is lost and the drive voltage may fluctuate. Alternately, the moveable beam 50 can be isolated by depositing a thin layer of dielectric on its sides.

Still referring to FIG. 2 that shows a top-down view of the MEM varactor "chip side" substrate according to the invention, the comb-drive electrodes are 50A. The movable electrode is built within the substrate or on a dielectric layer deposited on top of the substrate FIG. 2 illustrates the case where movable electrode 50 is connected to the dielectric on both sides using a double-hinged flexure supports. The movable electrode can be supported by variety of flexure supports providing different spring constant to the beam. Such flexure supports can be single hinged, serpentine, crab-leg, fixed-fixed supports. Metal electrodes 50A and 50 can be of different or same material, latter is preferable for better electrical connectivity. A cavity 30 is formed in the dielectric or substrate, beneath the movable beam 50 allowing the structure to move freely. The corresponding electrode 50 is formed within the dielectric and over the cavity 30 which is filled with sacrificial material using in conventional semiconductor fabrication techniques such as damascene approach. The electrodes 50A can be formed over the electrode 50 using through plating approach. When a voltage differential is applied to the electrodes 50 and 51B, an electrostatic force attracts moveable electrode 50 towards stationary electrode 51B, causing electrode 50 to deflect or move towards the stationary electrode. When the electrode deforms, the signal electrode(s) 51A record the change in capacitance due to change in gap distance between the electrodes.

Figure 3:
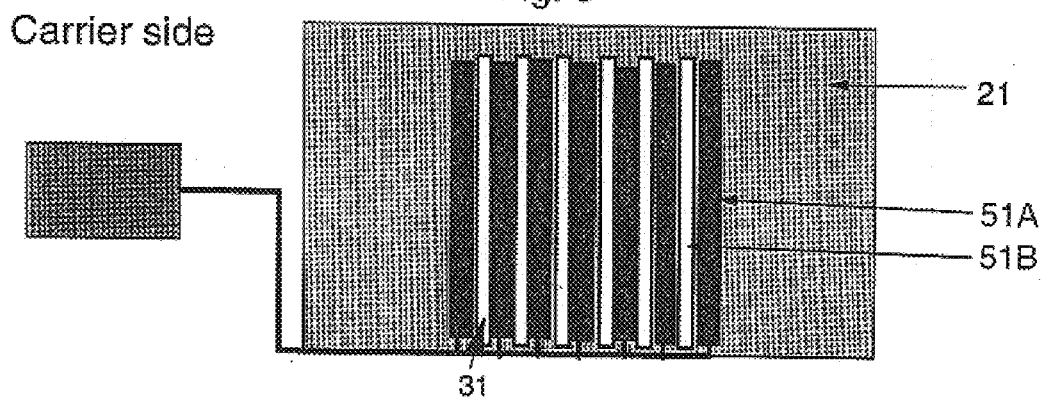
FIG. 3 is a top-down view of the fixed part (bottom, carrier side) of the device shown in FIG. 1, according to the present invention
Figure 3A:
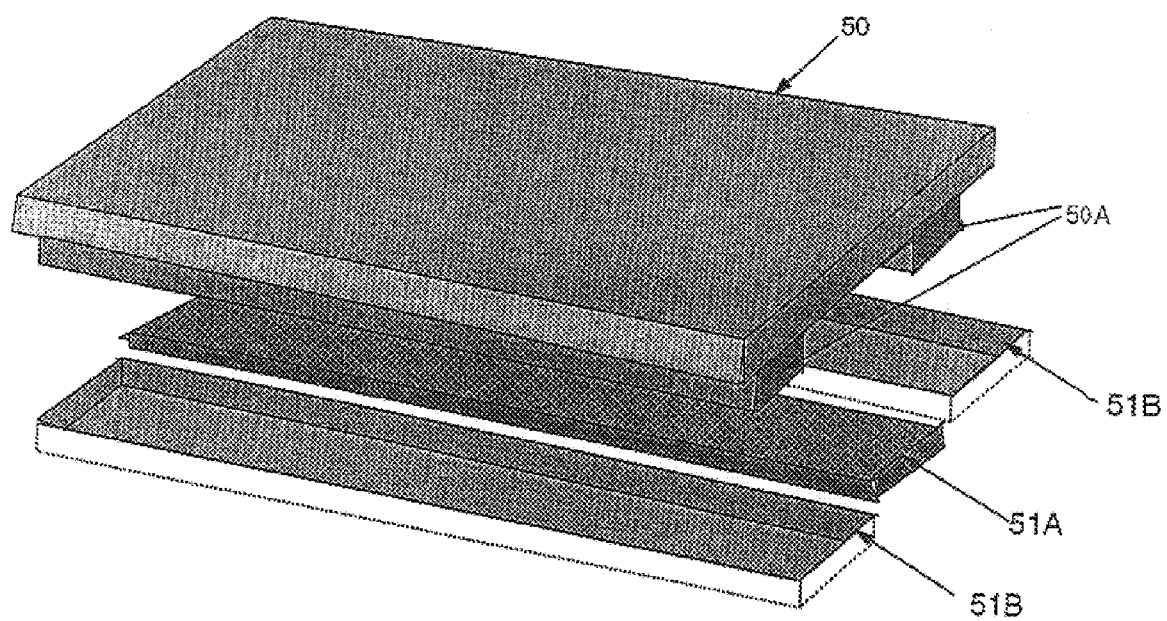
FIG. 3A is a perspective view of the MEM switch, according to the invention.

FIG. 3 is a top-down view of the carrier side substrate illustrating the driving electrodes 51B, signal electrodes 51A and trench gap 31 embodied in insulating material 21 over substrate 11 (FIG. 1).

The MEM device is also configured such that the drive electrodes can be of variety of configurations to maximize the comb-drive active area for lower drive voltages FIG. 2 shows the one particular combination of the comb-drive electrodes 51B. In addition to such a configuration, a maze type configuration shown in FIG. 4 and pin configuration in FIG. 6 can be used. A maze type configuration (FIG. 4) is expected to minimize the lateral pull-down effect of the comb-drive electrodes due to increases stiffness of the electrodes. Other configurations for comb-drive electrodes 50A are also possible. FIGS. 3, 5 and 7 show the corresponding bottom electrode configurations for FIGS. 2, 4 and 6 respectively. For example, FIG. 3 illustrates the concept where in signal electrodes, 51A are in between the cavity areas and along the sidewalls of the cavities comb-drive electrodes 51A are formed.

Figure 8:
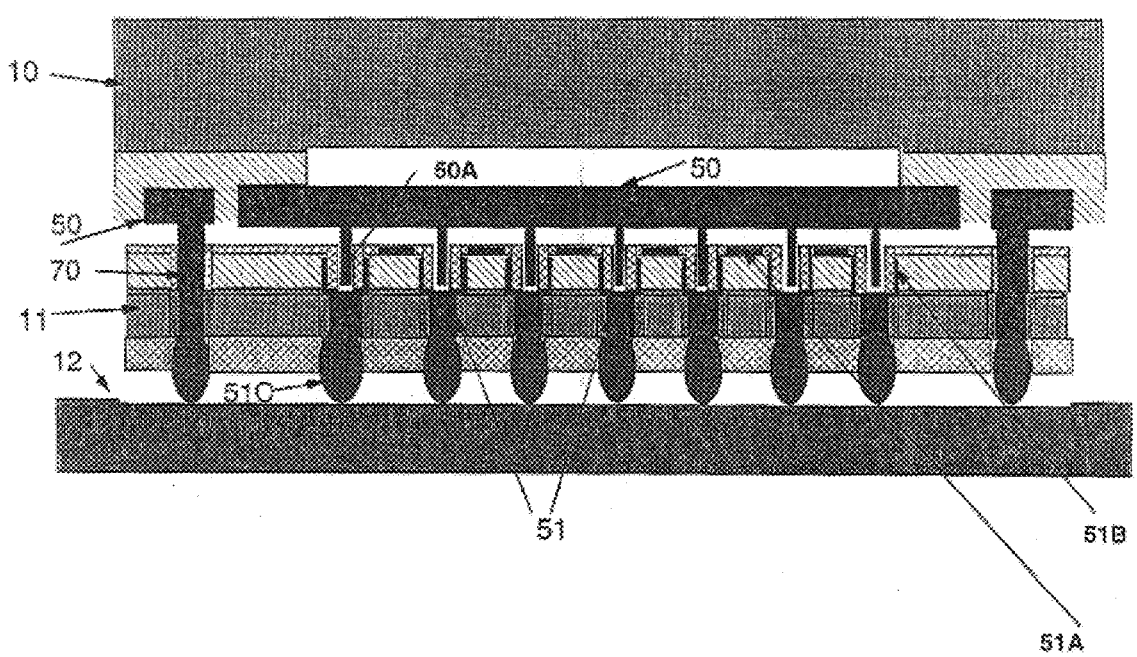

FIG. 8 illustrates another configuration of the MEM varactor device, packaged using the solder bumps 51C for electrical feed through. In this packaging approach, the carrier substrate is attached to a temporary substrate (not shown) and the bottom substrate 11 is polished or ground to open the electrodes. Thereupon, conventional semiconductor bumping process can be used to make direct electrical connection to the bottom electrodes using solder bumps. The temporary substrate 11A (not shown) is then removed. Typical height of the solder bumps are of the order of 0.1 to 1 mm. The carrier substrate can be diced and individual components are attached to an organic or ceramic substrate 12 for electrical connections. Using this approach wafer level alignment and bonding of the "chip side" of the device can be done to carrier side of the device providing the advantages of improved yield and lower cost of manufacturing.

FIGS. 9 through 21 show the process sequence which can be used for fabrication of the top chip-side of the MEM varactor device using the present invention and FIGS. 22 through 39 show the process sequence which can be used for fabrication of the bottom carrier-side of the MEM varactor device. Step-step process sequence is described briefly below:

Chip-side Process Sequence

Figure 9:
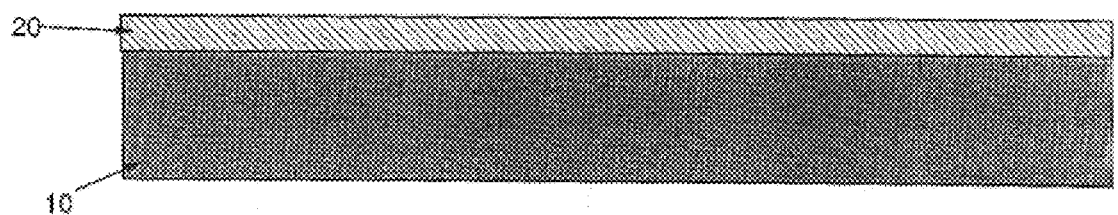
Figure 10:
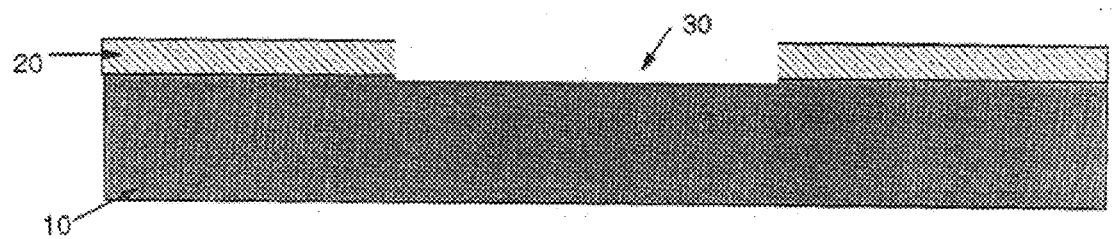

FIG. 9 shows the first step of the fabrication process wherein insulating or semi-insulating material 20 is deposited on top of the chip-side substrate 10. Preferably, the thickness of the material 20 is to match the height of a cavity intended to be formed beneath the movable electrode and allowing free motion of the structure. FIG. 10 shows the cavity 30 formed in material 20 formed over the chip-side substrate 10 using conventional semiconductor lithography and patterning techniques.

Figure 11:
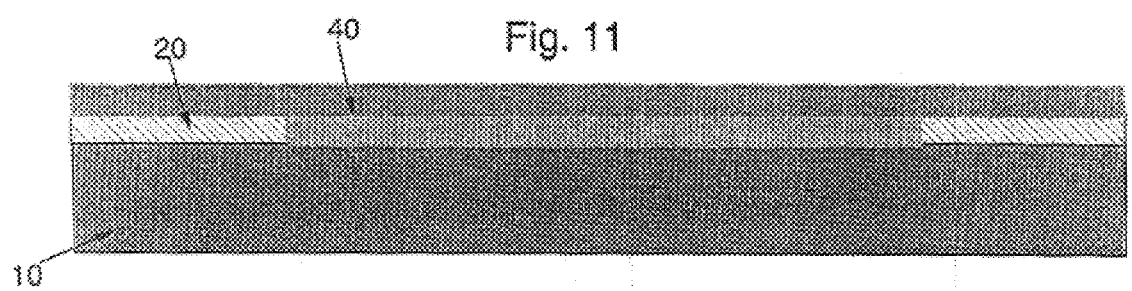
Figure 12:
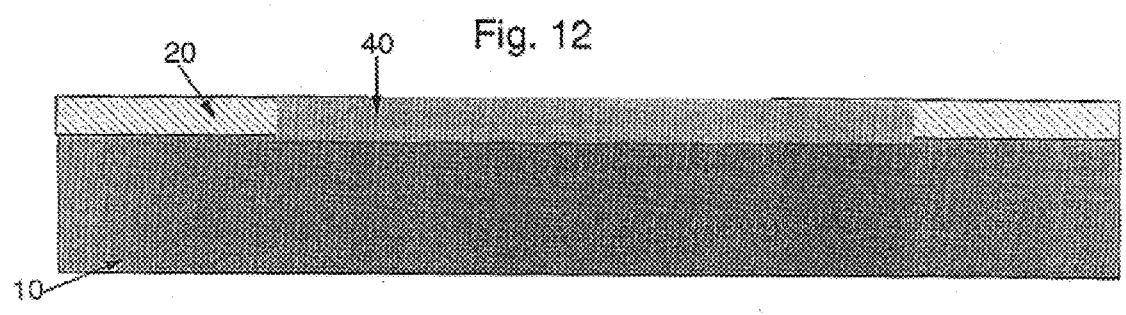
Figure 15:
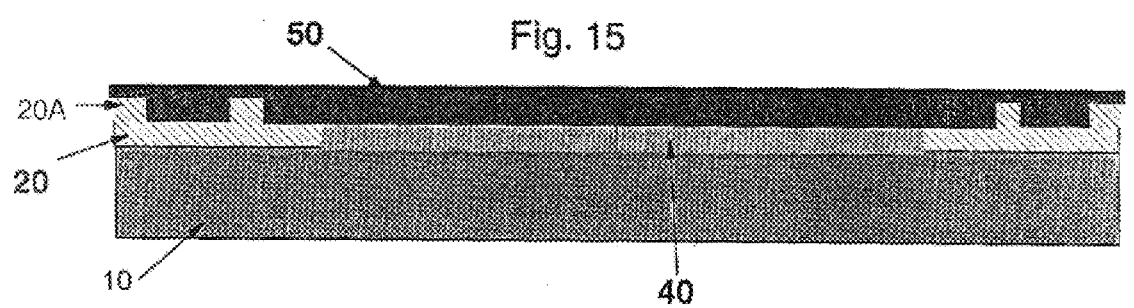
Figure 16:
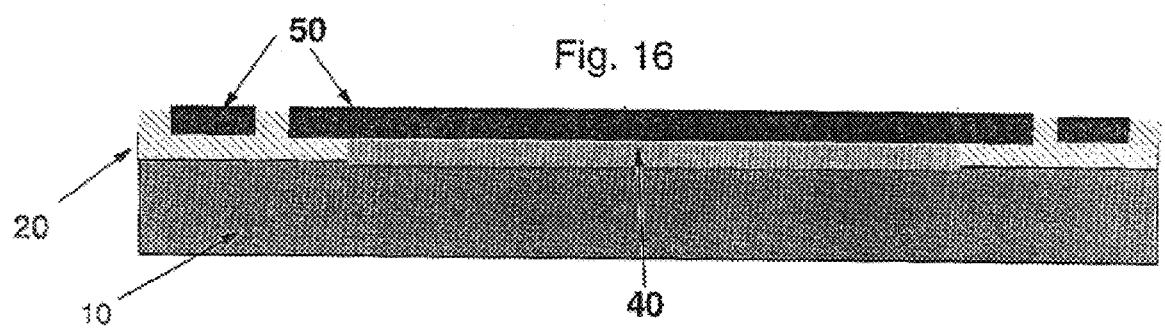
Figure 21:
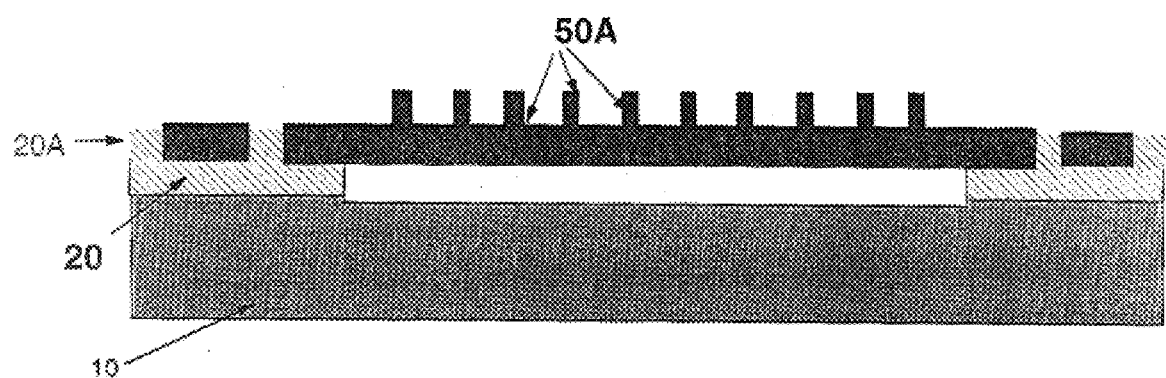

In FIG. 11, sacrificial material or polymer 40 is deposited to fill the cavity formed in the previous step. FIG. 12 illustrates the step of planarizing sacrificial material 40. An insulating or semi-insulating material 20A is then deposited over material 40 (FIG. 13). The insulating material 20A is then patterned and etched to form an opening for the formation of the movable electrode and associated connections 30. Seed layer 50C is then deposited for further processing (FIG. 14). In FIG. 15, conductive material 50 is deposited over the substrate using plating or other similar techniques. The thickness of the metal deposited should be at least equal to the thickness of the movable electrode. In FIG. 16, metal 50 is planarized to form the electrodes over the substrate. Seed metal 50B, e.g., chrome-copper, is then deposited over the substrate for selectively plate the electrodes (FIG. 17). Resist or polymeric material 60 is then deposited and patterned to form a plurality of openings for the selective plating process (FIG. 18). In FIG. 19, comb-drive electrodes are plated through the resist or polymeric material. The polymeric material/resist 60 is then removed or stripped from substrate 10 to be followed by seed metal 50B being etched or removed (FIG. 20). FIG. 21 shows the final processing step of the chip-side wherein sacrificial material 40 underneath the movable electrode 50 is etched or removed to form a free standing movable beam. The structure can then be flipped over onto the carrier side as shown in FIG. 1.

Carrier-side Process Sequence

Figure 22:
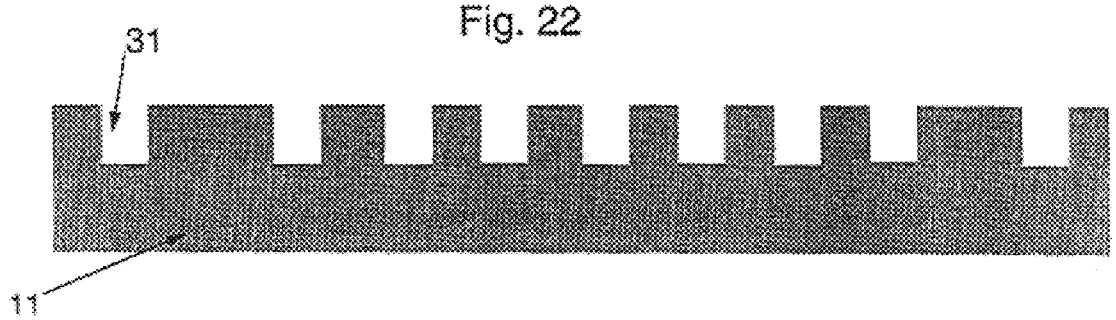
Figure 23:
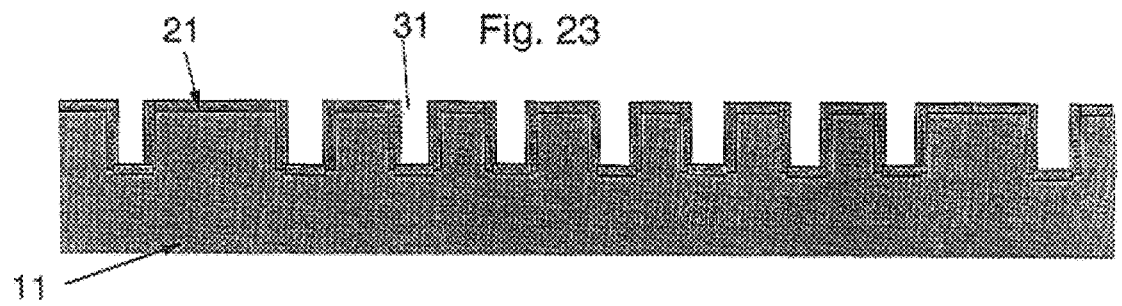
Figure 24:
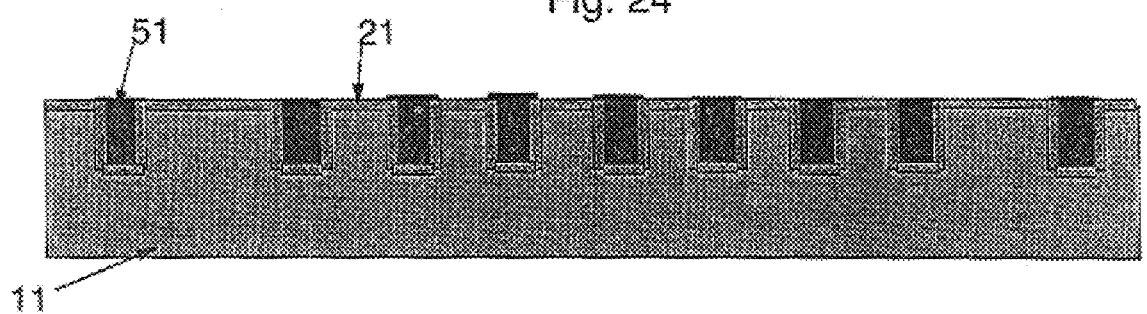
Figure 25:
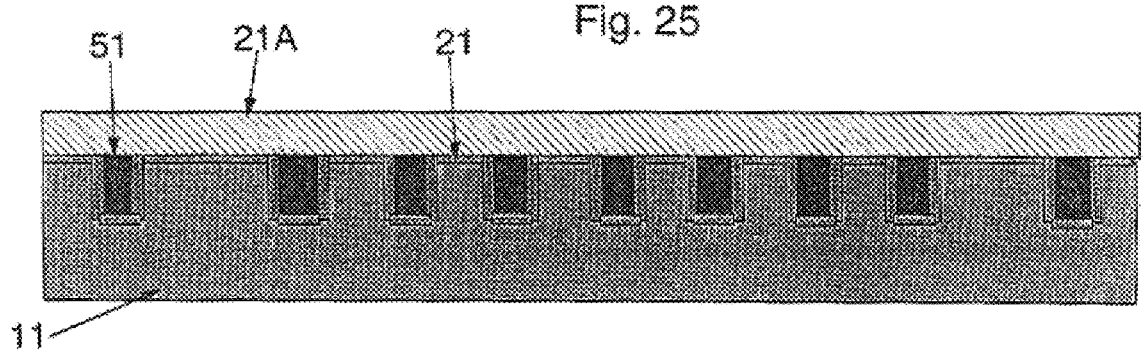
Figure 26:
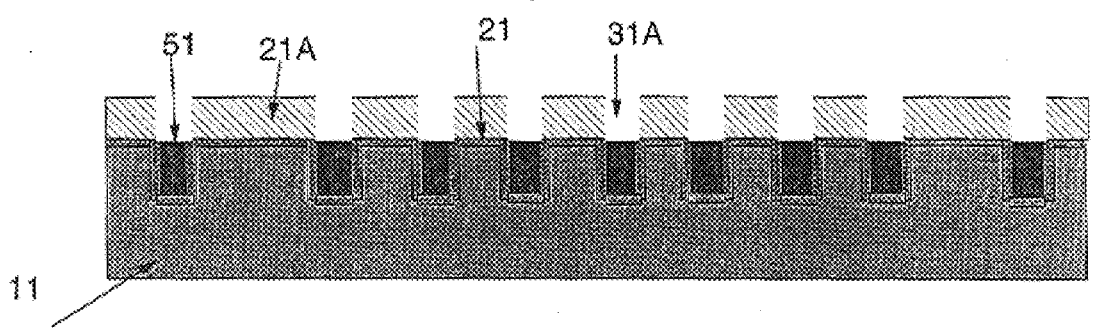
Figure 27:
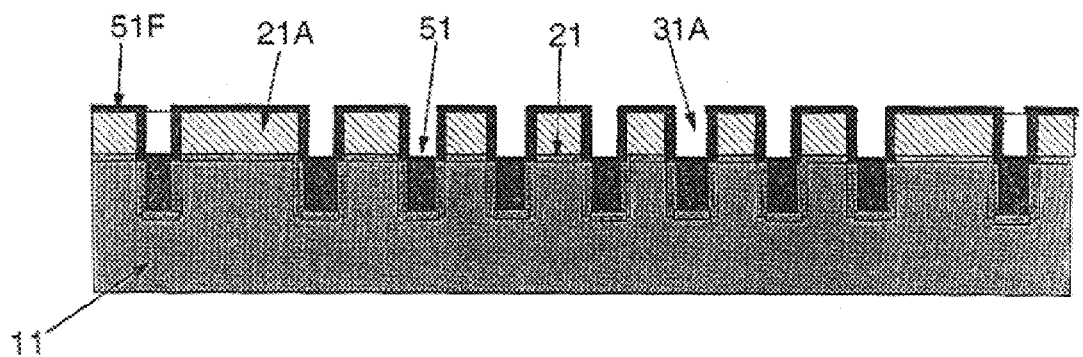
Figure 28:
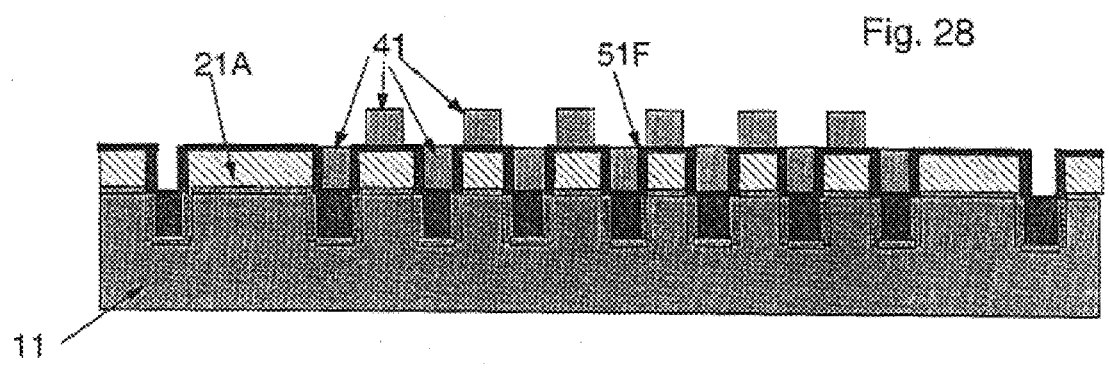

FIG. 22 illustrates the first step for processing the carrier-side ('bottom half') of the MEM varactor device. Substrate 11 is patterned and etched to fabricate a plurality of deep vias 31 to form the bottom electrodes. Insulating material or dielectric 21 is then conformally deposited over the vias (FIG. 23). Conductive material 51, preferably metal, is then embedded within the vias and planarized to form the bottom electrodes, as it is commonly done in a Damascene process (FIG. 24). Dielectric or insulating material 21A is deposited over the bottom electrodes (FIG. 25), the thickness of which determining the depth of the trenches for the comb-drive electrodes, the thickness of which should be at least equal or greater than the height of the comb-drive electrodes 50A previously fabricated on the chip-side (FIG. 21). Dielectric material 21A is then patterned and etched to form openings 31A over the bottom electrodes (FIG. 26). Conductive material or metal 51F is then deposited over the patterned dielectric (FIG. 27). Resist or polymeric material 41 is blanket deposited over the structure and patterned to expose portions of the metal 51F (FIG. 28).

Figure 29:
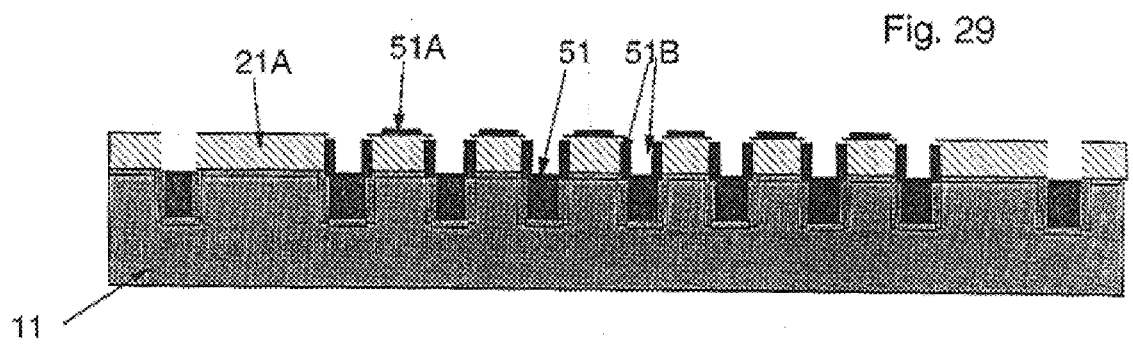
Figure 31:
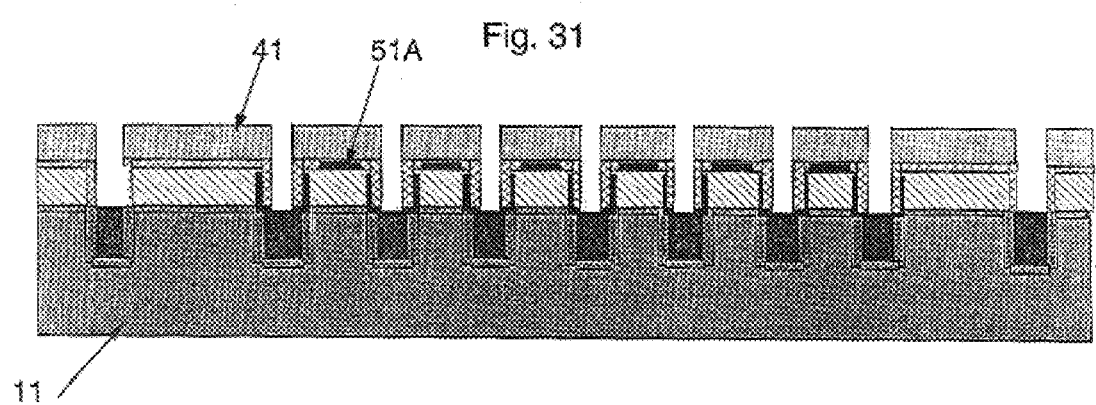
Figure 34:
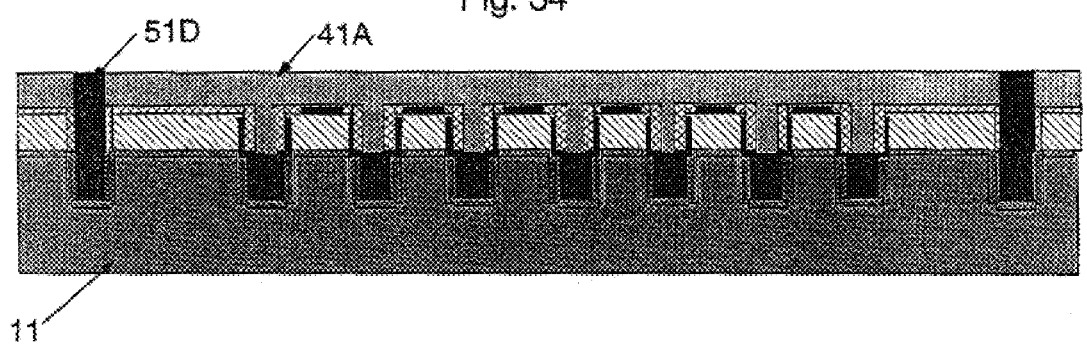
Figure 35:
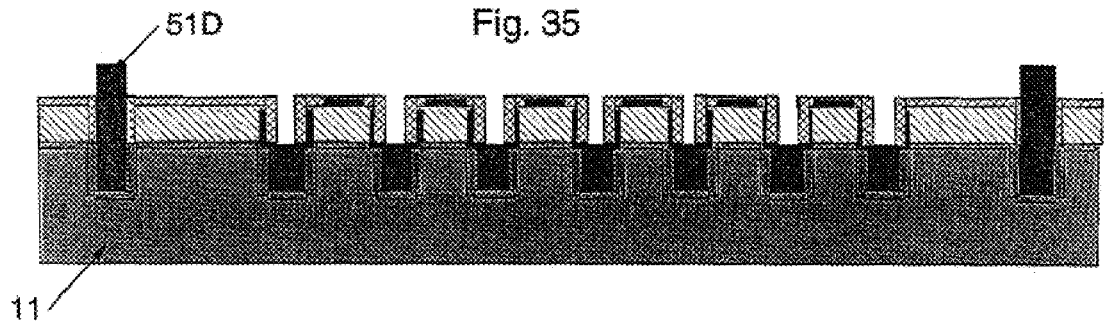

In FIG. 29, the exposed metal is etched except in the areas where the resist/polymer covers the metal, forming the drive electrodes 51B and signal electrodes 51A. The resist or polymeric material is then removed. Insulating material 21B is deposited over the openings to cover the electrodes 51A and 51B (FIG. 30). Resist or polymer material is then patterned and the dielectric material 21B is etched at the bottom of the openings (FIG. 31). Resist or polymer 41A is again blanket deposited and patterned to selectively open the regions at the interconnections or contact pads 51 on either side of the device (FIG. 32). Thereafter, seed metal 51E, e.g., chrome-copper, is deposited over polymer 41A (FIG. 33). The thickness of the polymer 41A is a critical parameter since it determines the height of the raised contact electrodes and the initial gap distance between top and bottom electrodes. FIG. 34 shows the step wherein metal 51D (of the same material as 51) is deposited over the contact pads and is planarized. FIG. 35 shows the final processing step for the carrier-side substrate, wherein the resist or polymeric material 41A is removed or stripped to expose raised contact pads 51D. Once the carrier and the chip side substrates are completed, the chip side substrate can be diced and the chip-side device (movable beam) can be flipped over onto the carrier-side substrate, aligned and bonded to form the final device as seen in FIG. 1. Since individual "chip-side" devices can be bonded onto the carrier-side substrate simultaneously, yield and manufacturing costs can be lowered (wafer level packaging). Also, once the final device is formed, no additional packaging is necessary, as the device is completely surrounded by the substrate on either side. For applications requiring hermetic sealing of the MEMS device, vacuum lamination of the final device can be done using polymer resulting in good polymer encapsulation of the device.

Figure 36:
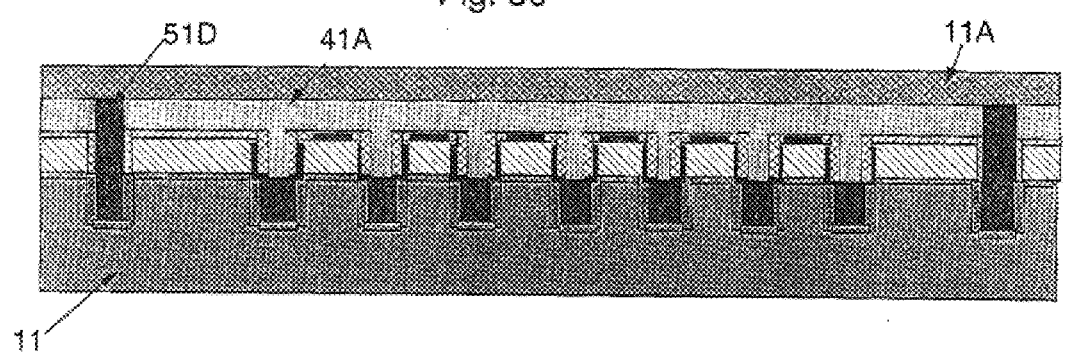
Figure 37:
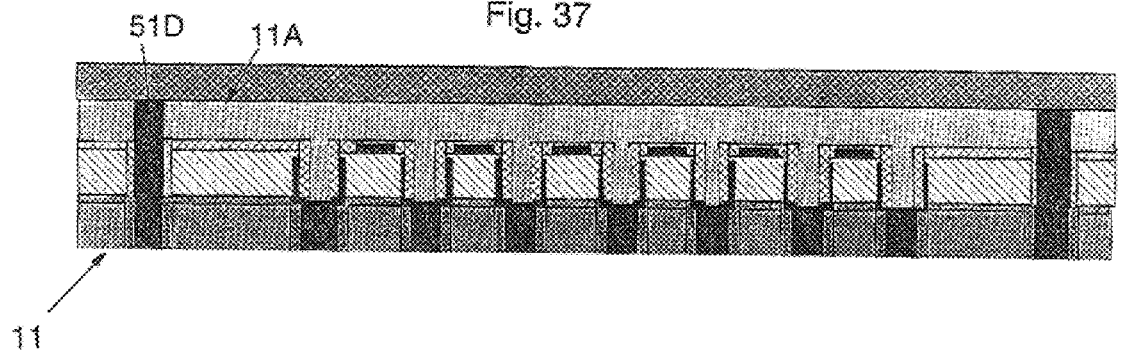
Figure 38:
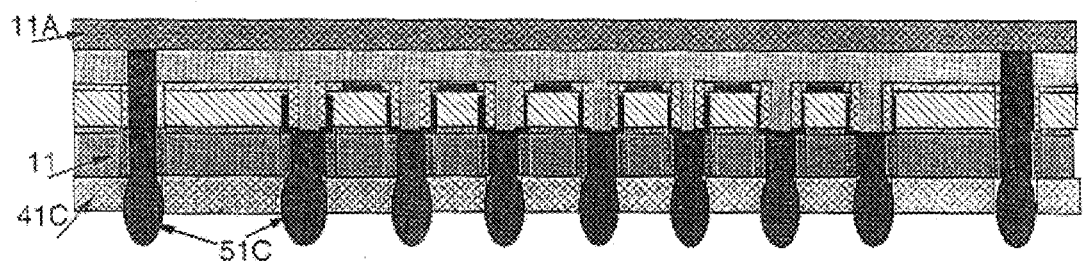

In another embodiment, the MEMS varactor device can also interconnected using an alternate fabrication method. After the carrier substrate with the raised contact pads (FIG. 34) is formed, polymeric material is left on top of the substrate and another temporary substrate 11A is attached to the top of the polymer (FIG. 36). Substrate 11 is then polished or ground to open the bottom of the electrodes for the interconnections (FIG. 37). Solder bumps of material 51C are attached to the bottom of the substrate using conventional bumping fabrication methods (FIG. 38). Typical material used for solder bumping is lead-tin, tin-silver. Insulating or semi-insulating polymeric material is deposited at the bottom of substrate 11 to ensure mechanical stability.

Figure 39:
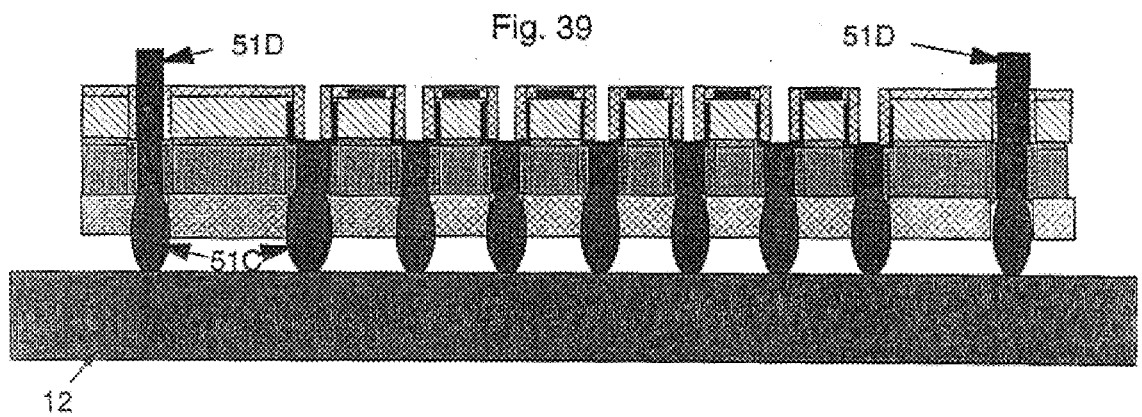

FIG. 39 shows the last processing step for the carrier-side of the device with solder bump interconnections. Herein, glass substrate 11A and polymeric material 41A are removed to expose raised contact pads 51D. The substrate can then be diced and attached to another organic or ceramic substrate 12 to provide the interconnections. Individual 'chip-side' devices can then be flipped over and bonded to the carrier substrate to form the final device as shown in FIG. 8.

the invention has been described in conjunction with a preferred embodiment, it is to be understood that many alternatives, modifications and variations will be apparent to those skilled in the art in light of the aforementioned description. Accordingly, it is intended to embrace all such alternatives, modifications and variations which fall within the spirit and scope of the appended claims. All matters set forth herein or shown in the accompanying drawings are to be interpreted in an illustrative and non-limiting sense.

What is claimed is:

1. A method of fabricating a micro-electromechanical (MEM) varactor comprising the steps of:
    a) depositing a first dielectric layer on a first substrate, the first dielectric layer having at least one cavity etched therein, filling and planarizing the at least one cavity with sacrificial material;
    b) forming a movable beam in the at least one cavity;
    c) depositing a second dielectric layer on the first substrate and forming a plurality of conductive fins within the second dielectric layer, coupling the conductive fins to the moveable beam;
    d) forming a plurality of cavities on a first dielectric deposited on a second substrate, filling and planarizing the plurality of cavities with sacrificial material;
    e) depositing a second dielectric layer on the first dielectric placed on the second substrate, filling the plurality of cavities with conductive material to form fixed electrodes between the cavities;
    f) forming raised contact pads surrounding the fixed electrodes;
    g) removing the sacrificial material from all the cavities to release the movable beam and the fixed electrodes; and
    h) dicing the first substrate and joining the second substrate to the diced first substrate while aligning the movable beam in the first substrate with the fixed electrodes in the second substrate.

2. The method as recited in claim 1, further comprising the steps of:
    i) following step g), depositing a third substrate on the second substrate and polishing and grinding the bottom of the second substrate to expose the fixed electrodes;
    j) depositing a dielectric layer underneath the second substrate, and forming solder bumps;
    k) coupling the second substrate to a fourth substrate, the fourth substrate being provided with interconnections;
    l) releasing all the sacrificial materials in all the cavities, and removing the third substrate to form raised contact pads; and
    m) aligning and joining the movable beam to the second substrate.

3. The method as recited in claim 1 wherein the first, second and third substrates are made of a material selected from the group consisting of Si, $SiO_2$, SiN, ceramic and a printed circuit board.

4. The method as recited in claim 1 wherein the fixed electrodes are formed along the sidewalls of the cavity formed on the second substrate to create three-dimensional (3-D) comb drives.

5. The method as recited in claim 4 wherein the 3-D comb drives are formed by:
    depositing drive electrode material in the cavity; and
    selectively etching the drive electrode material, allowing drive electrode material to remain on the sidewalls of the cavity.

6. The method as recited in claim 1 wherein the drive electrode material is made of a material selected from the group consisting of d. ele material Al, TaN, T, TiN, Ti, W, and Ru.

7. The method as recited in claim 5 wherein the 3-D comb drives are formed in the same metallization layer as the fixed electrodes.

8. The method as recited in claims 5 wherein the 3-D comb drives are insulated from the movable electrode by a dielectric.

9. The method as recited in claim 1 wherein the fins are high aspect ratio fins.

10. The method as recited in claim 1, wherein the fins are formed by:
    a) depositing a seed layer over the movable electrode;
    b) patterining a sacrificial material and metalizing through the sacrifical material; and
    c) removing the sacrificial material to expose the conductive fins.

11. The method as recited in claims 1 wherein forming the raised contact pads comprises the steps of:
    a) patterning the sacrificial material over the fixed electrodes;
    b) metallizing the patterned regions in the sacrificial material by PVD or electroplating followed by planarization; and
    c) removal of the sacrificial material to expose the raised contact electrodes.

12. The method as recited in claim 11 wherein metallizing the patterned regions in the sacrificial material is achieved by PVD (pressure vapor deposition) or by electroplating.

13. The method as recited in claims 1 wherein the raised contact pads are made of a material selected from the group consisting of Au, Cu, Sn, Pb, Ni and any alloy thereof.

14. The method as recited in claims 1 wherein the first and second substrates are coupled to each other by metal-to-metal bonding.

15. The method as recited in claims 1 wherein the first and second substrates are coupled by eutectic bonding.

16. The method as recited in claim 1, wherein forming the movable beam comprises the steps of:
    depositing a seed layer on the sacrificial material;
    electroplating the seed layer; and
    planarizing the electroplated seed layer, forming the movable beam thereon.

* * * * *